United States Patent
Nemati et al.

(10) Patent No.: US 6,888,177 B1
(45) Date of Patent: May 3, 2005

(54) INCREASED BASE-EMITTER CAPACITANCE

(75) Inventors: Farid Nemati, Menlo Park, CA (US); Scott Robins, San Jose, CA (US); Andrew Horch, Sunnyvale, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/253,350

(22) Filed: Sep. 24, 2002

(51) Int. Cl.[7] .............................................. H01L 29/74
(52) U.S. Cl. ........................ 257/132; 257/110; 257/142; 257/350
(58) Field of Search ................................ 257/110, 132, 257/142, 350, 138, 288, 347

(56) References Cited

U.S. PATENT DOCUMENTS

| | | | |
|---|---|---|---|
| 5,124,772 A | * 6/1992 | Hideshima et al. | 257/110 |
| 5,279,977 A | * 1/1994 | Kida et al. | 438/155 |
| 5,528,058 A | * 6/1996 | Pike et al. | 257/142 |
| 5,719,411 A | * 2/1998 | Ajit | 257/132 |
| 5,981,983 A | * 11/1999 | Funaki et al. | 257/138 |
| 6,104,045 A | 8/2000 | Forbes et al. | |
| 6,128,216 A | 10/2000 | Noble, Jr. et al. | |
| 6,225,165 B1 | 5/2001 | Noble, Jr. et al. | |
| 6,229,161 B1 | 5/2001 | Nemati et al. | |
| 6,552,398 B1 | * 4/2003 | Hsu et al. | 257/350 |
| 6,713,794 B1 | * 3/2004 | Suzuki | 257/288 |

OTHER PUBLICATIONS

Kim, Dong Myong. Electrical Characteristics of Npn–AIGaAs/GaAs HBTs with Modulated Base Doping Structures. *Journal of the Korean Physical Society*, vol. 33, No. 5, Nov. 1998. Pp 607–611.

* cited by examiner

*Primary Examiner*—David Nelms
*Assistant Examiner*—Dao H. Nguyen (57) ABSTRACT

A thyristor-based semiconductor device exhibits a relatively increased base-emitter capacitance. According to an example embodiment of the present invention, the junction area between a base region and an adjacent emitter region of a thyristor is increased, relative to the junction area between other regions in the thyristor. In one implementation, the base region is formed extending on two sides of the emitter region. In another implementation, the thyristor is formed on a buried insulator layer of a silicon-on-insulator (SOI) structure, with the base region having a first portion laterally adjacent to the emitter region and having a second portion between the emitter region and the buried insulator.

18 Claims, 5 Drawing Sheets

INCREASED BASE-EMITTER CAPACITANCE

FIELD OF THE INVENTION

The present invention is directed to semiconductor devices and, more specifically, to semiconductor devices having thyristor-based devices and to thyristor-based memory.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that capacitive coupling between a control port and a thyristor base region can substantially modulate the potential of the base region. Another important consideration for thyristors used in such NDR devices is to ensure tight control over the conductance state of the thyristor.

These and other design considerations have presented challenges to implement such a thin capacitively-coupled thyristor in a variety of circuit implementations.

SUMMARY

The present invention is directed to overcoming the above-mentioned challenges and others related to the types of devices and applications discussed above and in other thyristor-based semiconductor applications, such as memory cells. The present invention is exemplified in a number of implementations and applications, some of which are summarized below.

According to an example embodiment of the present invention, a thyristor is manufactured having adjacent emitter and base regions that have a junction area that is relatively larger than junction areas between other base and emitter regions of the thyristor. For instance, in taking a complete cross-section of the area (e.g., the total junction area) between two adjacent thyristor regions, the above-discussed adjacent emitter and base regions share a junction area that is relatively larger than other junction areas between base and emitter regions of the thyristor. In connection with this example embodiment, it has been discovered that such an increased junction area is useful for increasing the capacitance between the emitter and adjacent base region. With this approach, the conductance state of the thyristor is readily controlled, which is particularly useful in memory implementations.

According to another example embodiment of the present invention, the thyristor discussed above is disposed on a buried insulator region of silicon-on-insulator structure in a semiconductor substrate. The base region includes an upper portion adjacent to the emitter region and an extended portion disposed below the emitter region and between the buried insulator region and the emitter region.

In a more particular example embodiment of the present invention, a pass device is coupled in series to a second emitter region of the thyristor. A control port is arranged for capacitively coupling a signal to a second base region of the thyristor and for controlling current flow therein. A reference voltage line is coupled to the adjacent emitter region discussed above, and in response to signals (i.e., voltages) applied to the control port and the pass device, current flow in the thyristor, and thus the state of the second emitter region, is controlled. The controlled state of the second emitter region is used for storing data therein.

In another example embodiment of the present invention, a memory circuit arrangement includes an array of memory cells adapted for storing data. At least some of the memory cells include a thyristor having adjacent base and emitter regions with an increased capacitance, a pass device and control port, as discussed above. The control ports of the cells and the pass devices are coupled to word lines adapted for applying the signals to the thyristors and pass devices for controlling data storage and manipulation at the thyristor.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications benefiting from high base-emitter capacitance. While the present invention is not necessarily limited to such applications, various aspects of the invention may be appreciated through a discussion of various examples using this context.

According to an example embodiment of the present invention, a base region of a thyristor is disposed laterally adjacent to an emitter region of the thyristor with a portion of the base region extending below the emitter region. The extended portion of the base region increases surface-to-surface contact area between the base region and the emitter region. In connection with this example embodiment, it has been discovered that, using a base region with such an extended portion, the thyristor exhibits a relatively low Gummel number (e.g., relative to the total number of majority carriers per unit area in the base region). This arrangement is particularly useful in thyristor-based memory implementations, with the thyristor exhibiting electrical characteristics, such as an increased current density at the emitter, that are a function of the reduced Gummel number.

In another example embodiment, a thin capacitively-coupled thyristor includes a first base region and an adjacent first emitter region having an extended junction area, as discussed above, with a control port capacitively coupled to a second base region for controlling current flow therein. The length of the extended junction area is selected to increase the capacitance between the adjacent base and emitter regions, as discussed above, such that capacitance between the first base region and the control port is relatively insignificant. This approach is useful for a variety of implementations. For instance, in order to improve the control port's ability to control the second base region, the capacitance between the control part and the second base region is desirably larger than all other capacitance coupled to the second base region. In this regard, the junction area between the first emitter region and the first base region is selected to be large enough (e.g., relative to the junction area between the first and second base regions) so that a voltage applied to the control port for controlling the second base region does not significantly affect the first base region. More specifically, the resulting capacitance between the first base region and the first emitter region is stronger than the capacitance between the first base region and the control port. Using this approach, the first base region is minimally, if at all, coupled to the control port when the control port is coupled to move the potential of the second base region.

Figure 1:
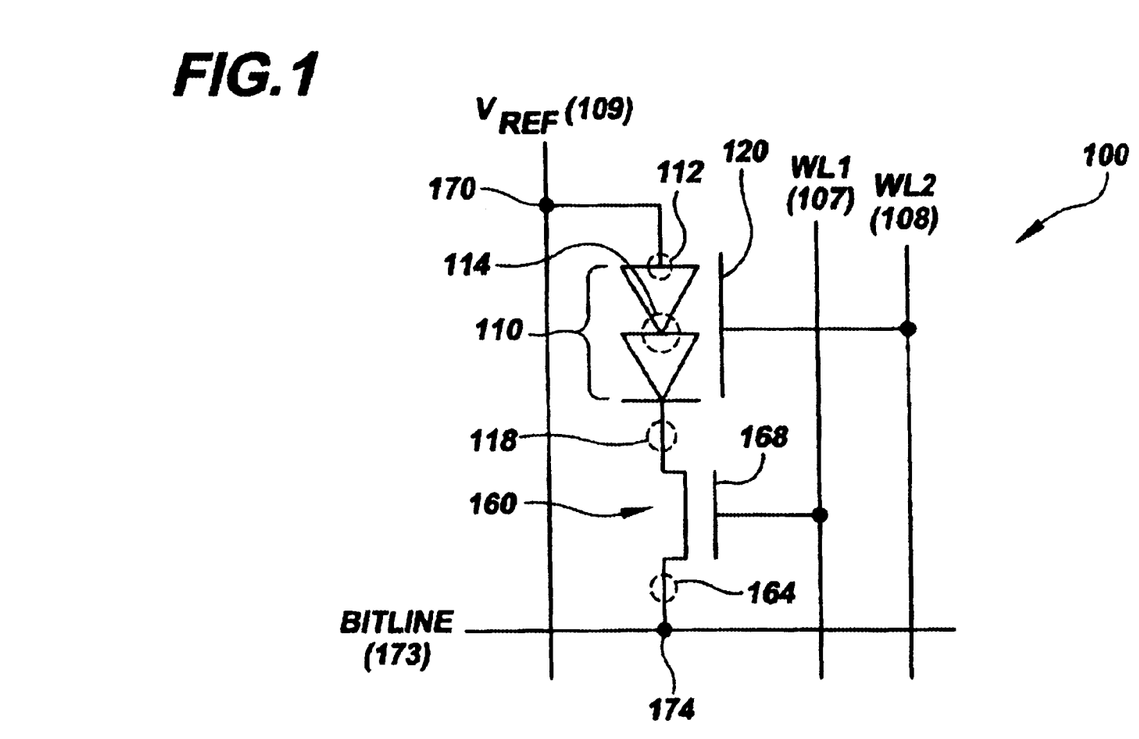
FIG. 1 is a circuit arrangement including a thyristor having a shallow emitter region, according to an example embodiment of the present invention.

FIG. 1 shows a circuit arrangement 100 having a thyristor body 110 with a thyristor base region 114 adjacent to and having an extended portion below a thyristor emitter region 112, according to another example embodiment of the present invention. In one implementation, the extended portion of the base region 114 is disposed on a buried insulator region (not shown) and separates the emitter region 112 therefrom. Example arrangements of such an extended base portion over a buried insulator region that may be implemented with this example embodiment are shown in the following figures. This particular arrangement results in an increased junction area between the base and emitter regions, relative to a junction area that would exist, were the extended portion not present. In connection with this approach, it has been discovered that the Gummel number of the thyristor body 110 is lowered and that the circuit arrangement 100 exhibits properties that are particularly useful in memory implementations.

A pass device 160 is coupled in series with the thyristor body 110 and provides access to a storage node 118. Control port 120 and gate 168 are arranged for capacitively coupling signals to the thyristor body 110 and the pass device 160, respectively. The capacitively coupled signals control the state (current blocking and current passing) in which each of the devices exists, thereby controlling current flow in the thyristor body 110 and pass device 160. The emitter region 112 is coupled to a reference voltage (Vref) line 109 via contact 170, and a source/drain region 164 of the pass device 160 is coupled to a bit line 173 via a bit line contact 174. First and second word lines 107 and 108 (WL1 and WL2) are coupled to the gate 168 and control port 120, respectively. In response to signals applied via WL1 107 and WL2 108, as well as to Vref line 109 and to bit line 173, data at storage node 118 is manipulated (e.g., for read and write access). For general information regarding data storage and manipulation with a thyristor-based device, such as the device 100, and for specific information regarding controlling current in a thyristor-based device with a capacitively-coupled control port, reference may be made to U.S. Pat. No. 6,229,161 (Nemati et al.).

Figure 2:
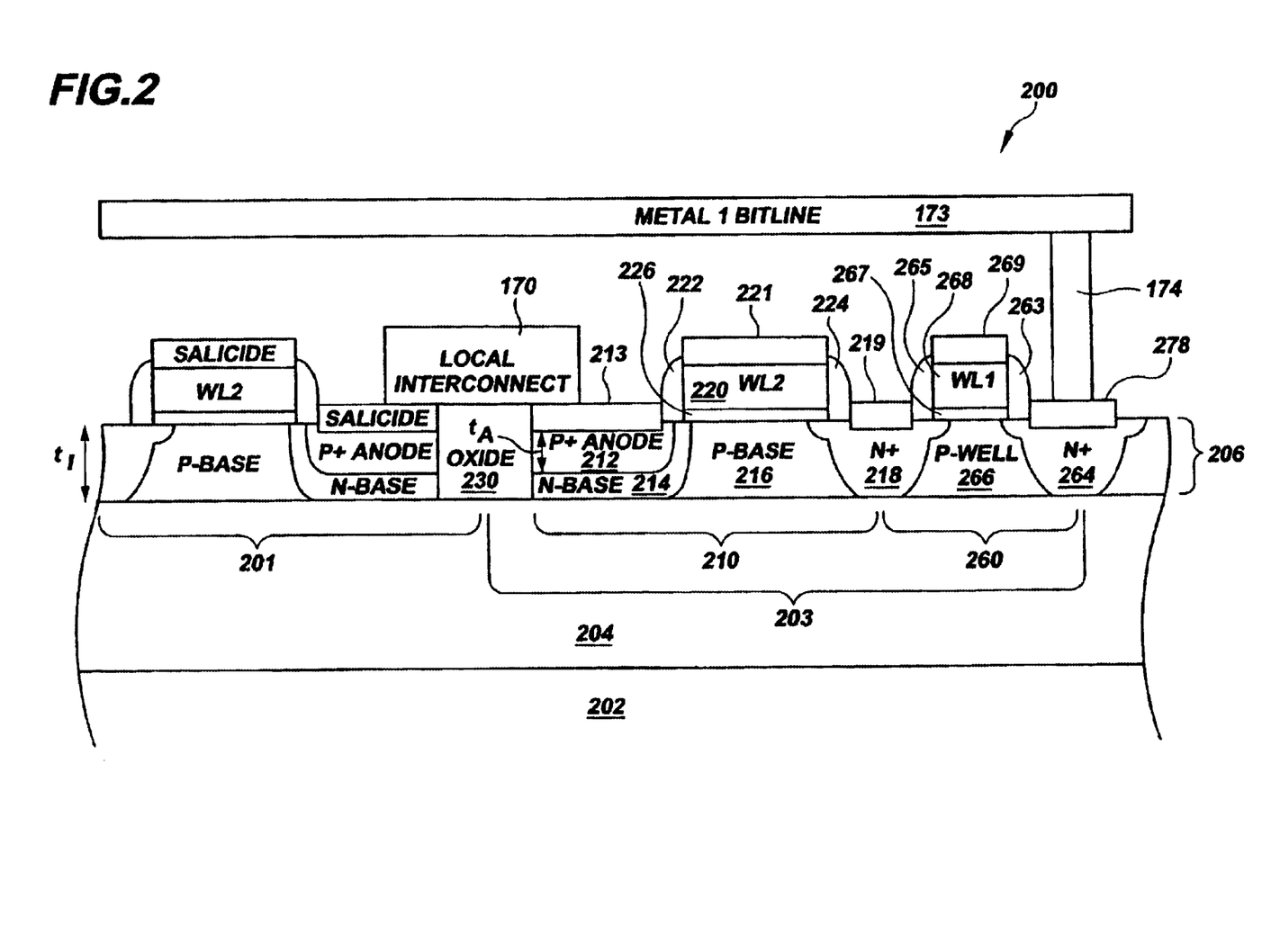
FIG. 2 is a semiconductor device including a thyristor having a shallow emitter region, similar to the circuit arrangement in FIG. 1, according to another example embodiment of the present invention.

FIG. 2 is a thyristor-based semiconductor device 200 having an extended base region in a silicon layer 206 over a buried insulator layer 204, according to another example embodiment of the present invention. The device 200 may, for example, be implemented in connection with the circuit arrangement 100 shown in FIG. 1. The device 200 includes a first memory cell 203 insulated from a mirrored memory cell 201 by an oxide region 230, with discussion of certain articles of the mirrored memory cell 201 omitted for brevity. The device 200 includes a substrate 202 having the buried insulator layer 204 over which a thyristor body 210 and pass device 260 (implemented here as a transistor) are formed in silicon layer 206. Four contiguous regions including P+ anode emitter region 212, N-base region 214, P-base region 216 and N+cathode emitter region 218 form the thyristor body 210. A thyristor control port 220 is over and separated from the P-base region 216 by a dielectric material 226, with insulative sidewall spacers 222 and 224 on opposing sides of the control port 220 and with a salicide region 221 on the control port 220. In one implementation, the control port 220 and the P-base region 216 are arranged such that a signal applied to the control port changes the potential across the P-base region 216, and in another implementation, across a majority of a cross-section of the P-base region 216.

The arrangement of the N-base 214 extending between the P+ emitter 212 and the buried insulator region 204 results in a relatively large junction area therebetween. For instance, the junction area between P+ emitter 212 and the N-base 214 would otherwise more closely resemble the junction between N-base 214 and the P-base 216, would the N-base 214 not extend below the P+ emitter as shown. Using this approach, it has been discovered that the Gummel number of the thyristor is reduced, relative to the Gummel number exhibited with smaller junction area. Such a reduced Gummel number has been found to be particularly useful in thyristor implementations, such as embedded memory and other memory implementations.

The thyristor body 210 is coupled in series with the pass device 260 at the N+ emitter region 218, which is shared with the pass device 260 as a first source/drain region. The pass device further includes a second source/drain region 264, separated from the N+ emitter region 218 by a P-channel region 266. A gate 268 is separated from the P-channel region 266 by a dielectric material 267, with insulative sidewall spacers 265 and 263 on opposing sides of the gate 268 and with a salicide region 269 on the gate 268 for making electrical contact thereto.

The P+ emitter region 212 is coupled to a local interconnect 170 via a salicide region 213, and to a bit line 173 via a bit line contact 174. In addition, first and second word lines are electrically coupled to the gate 268 and control port 220 via salicided portions 269 and 221, respectively (e.g., the first and second word lines may include the gate 268 and the control port 220). The thyristor 210 is arranged such that the control port 220 capacitively couples a signal to the P-base region 216 for controlling current flow in the thyristor 210 between the emitter regions 212 and 218 in response to a voltage applied to the second word line. The pass device 260 is similarly arranged such that the gate 268 capacitively couples a signal to the P-channel region 266 in response a voltage being applied to the first word line, for controlling current flow between the source/drain regions 218 and 264.

The arrangement of the portions of the thyristor body 210 discussed above is selected for particular applications. In one implementation, the thickness $t_A$ of the P+ emitter 212 is between about 70% and 90% of the thickness $t_1$ of the silicon layer 206. In another implementation, the thickness $t_1$ of the silicon layer 206 is selected so that the thickness of the P base region 216 is sufficiently thin, such that a signal coupled thereto by the control port 220 biases a substantial portion of a cross-section of the P base region 216.

Various ones of the example embodiments described below in connection with the figures share similar features with each other and with FIGS. 1 and 2. In each of these Figures, certain discussion of similar features that are similarly numbered is omitted for brevity. In addition, as with mirrored portion 201 in FIG. 2, discussion of mirrored and/or repeated structures is likewise omitted.

Figure 3:
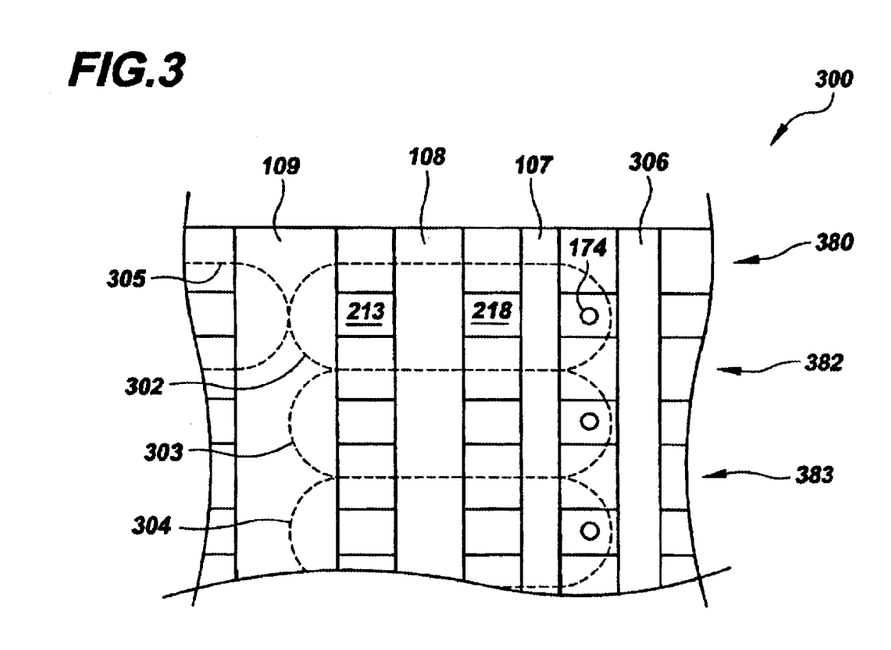
FIG. 3 is a memory array including the semiconductor device of FIG. 2, according to another example embodiment of the present invention.

FIG. 3 is a top-down view of a memory array 300 including the device 200 in FIG. 2 implemented in cell 302, according to another example embodiment of the present invention. Cell 302 has its selected shown articles labeled, with the description thereof also being applicable to cells 303–305. Referring to FIGS. 1 and 2 for reference, Vref line 109 is electrically coupled to the salicide portion 213 of the P+ anode, with a portion of the Vref line 109 including the local interconnect 170. Second word line 108 is arranged to capacitively couple a signal to P-base regions for each thyristor in cells 302–304. Similarly, first word line 107 is arranged to capacitively couple signals to P-channel regions in each pass device in cells 302–304. Bit lines (not shown) extend horizontally in parallel with each cell 302–304, with the bit line for cell 302 being electrically coupled to bit line contact 174 of cell 302 and similarly coupled to a bit line contact (not shown) for cell 305. Each cell is electrically isolated from adjacent cells by shallow trench isolation regions 380, 382 and 383, as well as by insulator regions (e.g., region 230 in FIG. 2) below local interconnect 109.

Figure 4A:
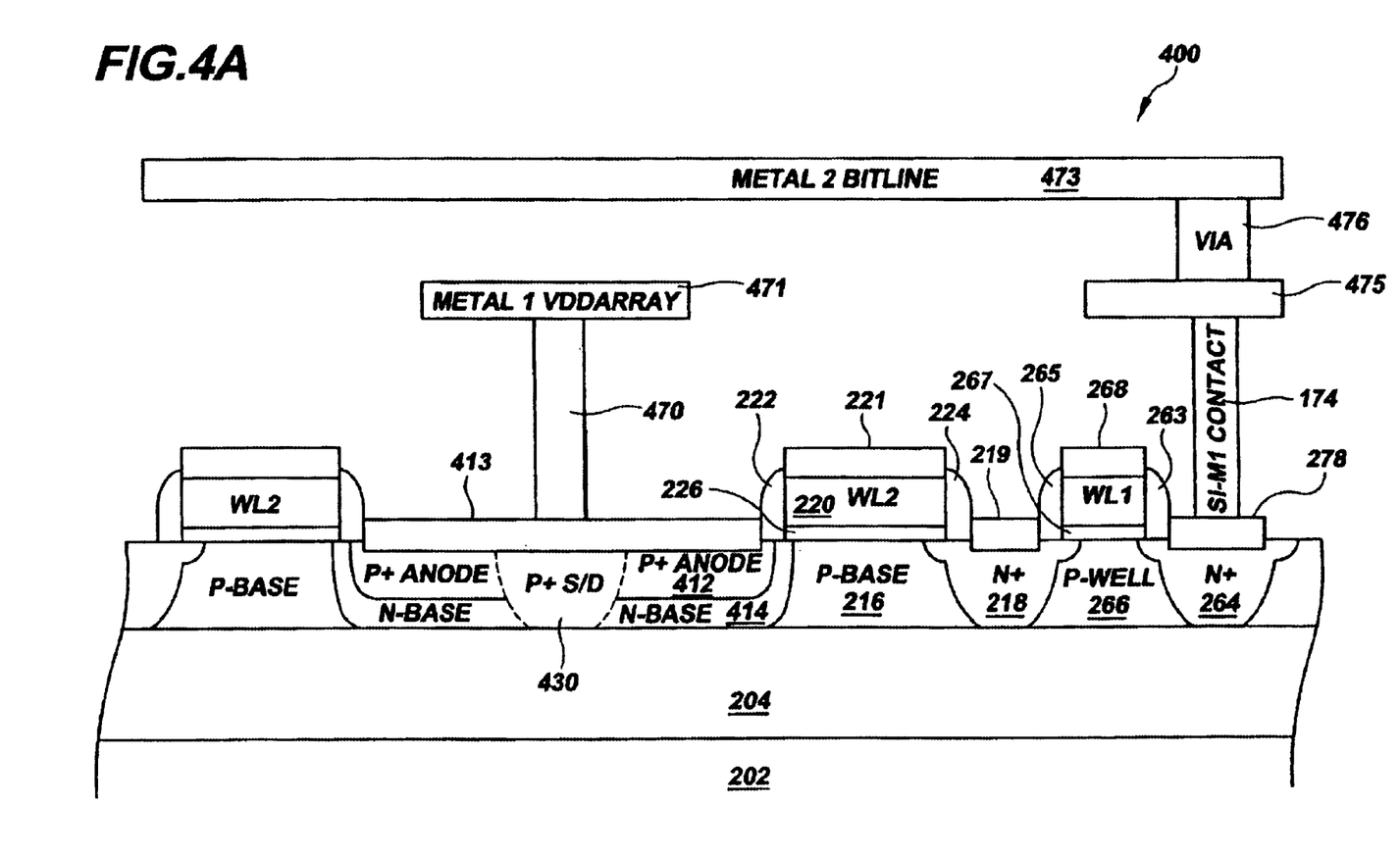
FIG. 4A is a semiconductor device having a shallow emitter region, according to another example embodiment of the present invention.

FIG. 4A is a thyristor-based semiconductor device 400, similar to the device 200 shown in FIG. 2 but having a P+ doped region 430 that is shared by adjacent devices for making contact to Vref line 471 (e.g., in a first metal layer) and for isolating the adjacent devices. In addition, first and second metal levels are used for Vref and bit lines 471 and 473, respectively, with Vref line 471 being electrically coupled to P+ anode emitter region 412 via contact 470, salicided portion 413 and P+ doped portion 430. With bit line 473 being in the second metal level, contact to the N+ source/drain region 264 is made using metal via 476, first level interconnect 475, bit line contact 274 and salicide portion 278. Similar to N-base region 214 in FIG. 2, N-base region 414 extends below the P+ anode emitter region, which increases the junction area therebetween. With this approach, adjacent circuits do not necessarily require insulative material, such as insulative portion 230 in FIG. 2, for electrically isolation.

Figure 4B:
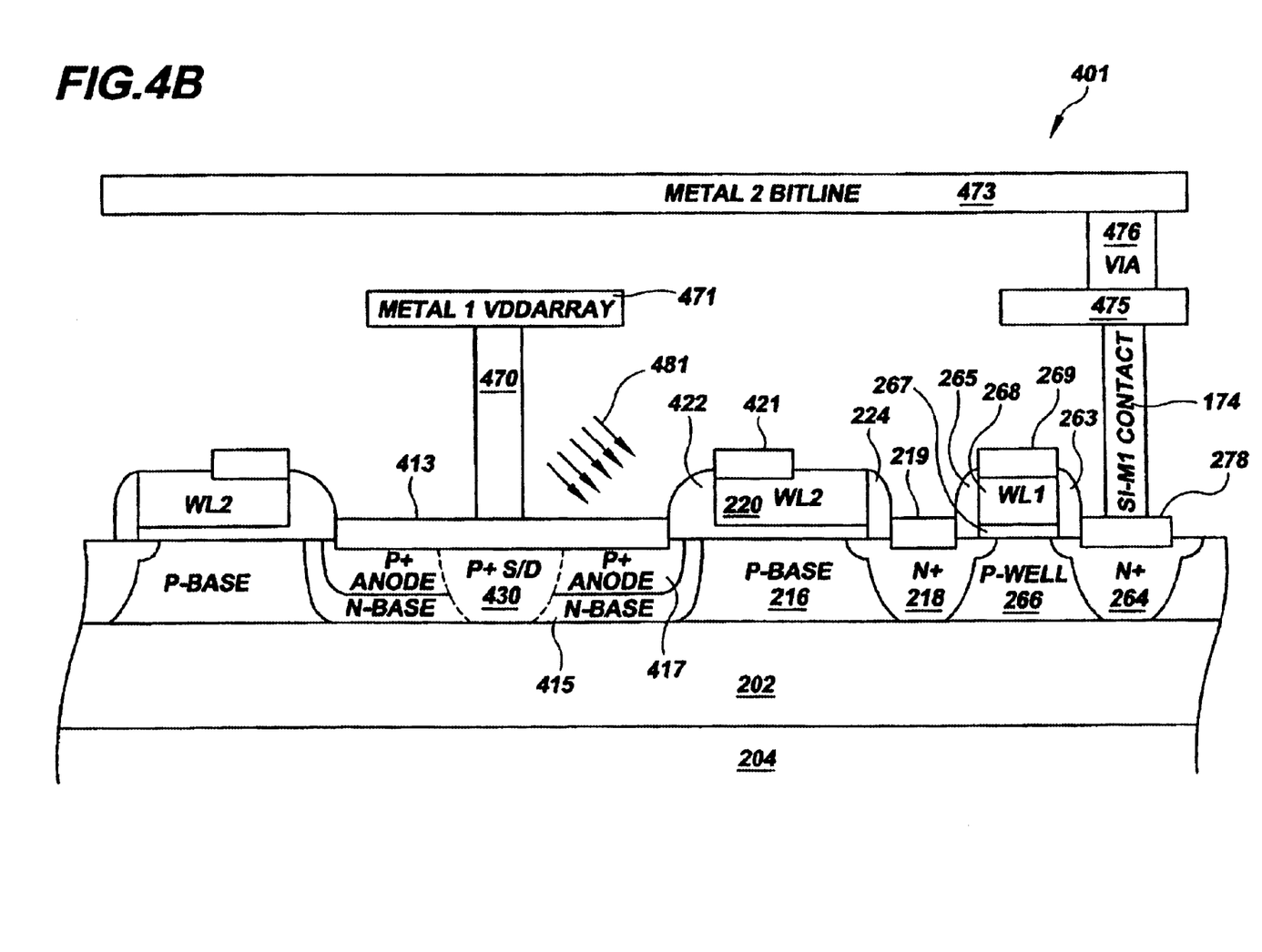
FIG. 4B is a semiconductor device with an angled N-base implant, according to another example embodiment of the present invention.

FIG. 4B is a thyristor-based semiconductor device 401, similar to device 400 shown in FIG. 4A but having an N-base region 415 implanted after the formation of an enlarged sidewall spacer 422 for the control port 220, according to another example embodiment of the present invention. The sidewall spacer 422 has a width that is large enough to space the N-Base region 415 away from the control port 220 (e.g., during implant) to avoid coupling between the control port and the N-Base region. Dopant implant for the N-base region 415 is effected using a high tilt and high energy, with ion implant represented by lines 481. The resulting N-base region 415 is self-aligned to the side wall spacer 422 and under the spacer 422 to avoid shorting the N-Base and P+ Anode with salicide 421 formed thereon. As shown, the salicide 421 covers only a portion of the control port 220; however, in various implementations, the salicide covers more and/or all of an upper surface of the control port 220, where the salicide 421 is formed.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and conductors; adding structures to the integrated circuit device; increasing the number of PN body sections in the thyristor; and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161 (discussed above), which is fully incorporated herein by reference. Such modifications and changes do not depart from the true spirit and scope of the present invention that is set forth in the following claims.

What is claimed is:

1. A thyristor comprising:
   a thyristor body region having a plurality of contiguous regions of opposite polarity including a first base region coupled to a first emitter region and a second base region coupled to a second emitter region, the first and second base regions being coupled to one another, with a junction between the first base region and the first emitter region being significantly greater in area than an area defined by a complete cross-section along any one of other junctions between the plurality of contiguous regions; and
   a thyristor control port configured and arranged for capacitively coupling at least to the second base region for controlling current flow in the thyristor body region.

2. The thyristor of claim 1, wherein a first portion of the first base region is disposed on a first side of the first emitter region and laterally between the first emitter region and the second base region and wherein a second portion of the first base region is disposed on a second side of the first emitter region.

3. The thyristor of claim 2, wherein the second portion of the first base region is disposed between the first emitter region and a buried insulator layer.

4. A thyristor-based semiconductor device comprising a substrate with a buried insulator region and a thyristor electrically coupled in series with a pass device, the thyristor and pass device being over the buried insulator region, the thyristor-based semiconductor device comprising:
   a thyristor body region having a first base region coupled to a first emitter region and a second base region coupled to a second emitter region, the first and second base regions being coupled to one another, wherein a first portion of the first base region is disposed laterally between the first emitter region and the second base region and wherein a second portion of the first base region is disposed vertically between the first emitter region and the buried insulator region;
   a thyristor control port configured and arranged to capacitively couple a signal to the second base region via a dielectric material disposed between the thyristor control port and the second base region; and
   the pass device being electrically coupled to the second emitter region and configured and arranged for controlling current flow to and from the first emitter region.

5. The thyristor-based semiconductor device of claim 4, wherein the first emitter region is sufficiently thin to facilitate capacitive coupling between a contact on the first emitter region and the first base region, the contact to the first emitter region being on an opposite side of the first emitter region, relative to the second portion of the first base region.

6. The thyristor-based semiconductor device of claim 5, wherein the thyristor body region is formed in a silicon layer disposed on the buried insulator region, the silicon layer having a thickness t, wherein the first emitter region has a thickness that is between about 70% and 90% of the thickness t and wherein the second portion of the first base region has a thickness that is t—the thickness of the first emitter region.

7. The thyristor-based semiconductor device of claim 6, wherein the thickness t is selected so that the second base region, having the thickness t, is sufficiently thin such that the thyristor control port biases a substantial portion of the cross-section of the second base region across the thickness t.

8. The thyristor-based semiconductor device of claim 4, wherein the thyristor is a thin capacitively-coupled thyristor.

9. The thyristor-based semiconductor device of claim 8 wherein the control port and the second base region are configured and arranged such that a signal applied to the control port changes the potential across a majority of a cross-section of the second base region.

10. The thyristor-based semiconductor device of claim 4, wherein the first base region is disposed on the buried insulator and wherein the first emitter region is disposed on the first base region.

11. The thyristor-based semiconductor device of claim 4, wherein the second emitter region is electrically coupled to the pass device.

12. The thyristor-based semiconductor device of claim 11 wherein the second emitter region is configured and arranged for storing data and wherein the pass device is configured and arranged to provide access to the data.

13. The thyristor-based semiconductor device of claim 12 wherein the pass device includes a transistor having a first and second source/drain region separated by a channel region and with a gate over the channel region, the first source/drain region being electrically coupled to the second emitter region and the second source/drain region being electrically coupled to a bit line, the gate being configured and arranged for controlling current flow between the bit line and the second emitter region.

14. The thyristor-based semiconductor device of claim 4, further comprising a plurality of cells over the buried insulator region, each cell having a thyristor electrically coupled in series with a pass device, wherein said first end portion is electrically isolated from a first end portion of an adjacent thyristor by an insulative region disposed over the buried insulator region and laterally between the adjacent thyristors.

15. The thyristor-based semiconductor device of claim 4, further comprising a plurality of cells over the buried insulator region, each cell having a thyristor electrically coupled in series with a pass device, wherein said first end portion is electrically isolated from a first end portion of an adjacent thyristor by a doped region having the same polarity as the first emitter region, the doped region being disposed over the buried insulator region and laterally between the adjacent thyristors.

16. The thyristor-based semiconductor device of claim 15 wherein the first emitter region includes the doped region.

17. The thyristor-based semiconductor device of claim 4, further comprising a second thyristor control port configured and arranged to capacitively couple a signal to the first base region via dielectric material disposed between the second thyristor control port and the first base region.

18. The thyristor-based semiconductor device of claim 17, wherein the second thyristor control port is configured and arranged for masking a portion of the first emitter region from being implanted.

* * * * *

UNITED STATES PATENT AND TRADEMARK OFFICE
CERTIFICATE OF CORRECTION

PATENT NO. : 6,888,177 B1
APPLICATION NO. : 10/253350
DATED : May 3, 2005
INVENTOR(S) : Nemati et al.

Page 1 of 1

It is certified that error appears in the above-identified patent and that said Letters Patent is hereby corrected as shown below:

In the Specification

Col. 5, line 13: "N+cathode" should read --N+ cathode--.

Col. 5, line 64: "$t_1$" should read -- $t_I$ -- .

Col. 5, line 66: "$t_1$" should read -- $t_I$ -- .

In the Claims

Col. 9, line 4, Claim 17: "via dielectric" should read --via a dielectric--.

Signed and Sealed this

Twenty-sixth Day of December, 2006

JON W. DUDAS
*Director of the United States Patent and Trademark Office*